(12) United States Patent
Hong et al.

(10) Patent No.: US 10,062,550 B2
(45) Date of Patent: Aug. 28, 2018

(54) SUBSTRATE PROCESSING APPARATUS

(71) Applicant: Samsung Electronics Co., Ltd., Suwon-si, Gyeonggi-do (KR)

(72) Inventors: Jung-Pyo Hong, Seoul (KR); Kwang-Nam Kim, Suwon-si (KR); Sang-Dong Kwon, Seoul (KR); Jong-Woo Sun, Seoul (KR); Sang-Rok Oh, Yongin-si (KR); Yong-Moon Jang, Incheon (KR)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 15/142,629

(22) Filed: Apr. 29, 2016

(65) Prior Publication Data
US 2017/0062245 A1    Mar. 2, 2017

(30) Foreign Application Priority Data

Aug. 27, 2015 (KR) .................. 10-2015-0120747

(51) Int. Cl.
*H01L 21/67* (2006.01)
*H01J 37/32* (2006.01)

(52) U.S. Cl.
CPC ...... *H01J 37/32715* (2013.01); *H01J 37/321* (2013.01); *H01J 37/32009* (2013.01); *H01J 37/32119* (2013.01); *H01L 21/67248* (2013.01)

(58) Field of Classification Search
None
See application file for complete search history.

(56) References Cited

U.S. PATENT DOCUMENTS

| | | |
|---|---|---|
| 7,445,726 B2 | 11/2008 | Wang et al. |
| 7,923,705 B2 | 4/2011 | Moriya et al. |
| 8,173,984 B2 | 5/2012 | Moriya et al. |
| 8,294,129 B2 | 10/2012 | Moriya et al. |
| 8,970,114 B2 | 3/2015 | Busche et al. |
| 2002/0043528 A1* | 4/2002 | Ito ............ H01L 21/67103 219/444.1 |
| 2002/0100557 A1 | 8/2002 | Li et al. |
| 2004/0011781 A1* | 1/2004 | Ito ............ H01L 21/67248 219/444.1 |

(Continued)

FOREIGN PATENT DOCUMENTS

| | | | |
|---|---|---|---|
| JP | 2008/232684 | * | 10/2008 |
| JP | 5312959 B2 | | 7/2013 |

(Continued)

OTHER PUBLICATIONS

JP2008-232684 Masuda Oct. 2008, translation (Year: 2008).*

*Primary Examiner* — Joseph A Miller, Jr.
(74) *Attorney, Agent, or Firm* — Myers Bigel, P.A.

(57) ABSTRACT

Provided are substrate processing apparatuses including a temperature measurement unit. The substrate processing apparatus comprises a chamber including a substrate processing region, a dielectric sheet that is disposed on the substrate processing region and includes an insertion hole and a temperature measurement unit that is disposed on the dielectric sheet to measure the temperature of the dielectric sheet, and has a screw portion inserted into the insertion hole, wherein each of the insertion hole and the screw portion has thread helixes meshed with each other.

20 Claims, 11 Drawing Sheets

(56) References Cited

U.S. PATENT DOCUMENTS

| | | | |
|---|---|---|---|
| 2004/0230341 A1* | 11/2004 | Suh | H01L 21/67248 |
| | | | 700/264 |
| 2005/0127912 A1 | 6/2005 | Pipe | |
| 2006/0191482 A1* | 8/2006 | Kanno | H01J 37/32935 |
| | | | 118/725 |
| 2006/0278167 A1* | 12/2006 | Braun | C23C 14/30 |
| | | | 118/726 |
| 2007/0079936 A1 | 4/2007 | Li et al. | |
| 2010/0265988 A1* | 10/2010 | Newman et al. | G01J 5/0003 |
| | | | 374/121 |
| 2011/0056626 A1 | 3/2011 | Brown et al. | |
| 2014/0024142 A1 | 1/2014 | Shriner et al. | |

FOREIGN PATENT DOCUMENTS

| | | |
|---|---|---|
| JP | 5314433 B2 | 7/2013 |
| KR | 10-2005-0059451 A | 6/2005 |

* cited by examiner

SUBSTRATE PROCESSING APPARATUS

CLAIM FOR PRIORITY

This application claims priority from Korean Patent Application No. 10-2015-0120747 filed on Aug. 27, 2015 in the Korean Intellectual Property Office, the disclosure of which is hereby incorporated herein by reference in its entirety.

FIELD

The present inventive concept relates to a substrate processing apparatus. More particularly, the present inventive concept relates to a substrate processing apparatus including a temperature measurement unit.

BACKGROUND

To manufacture a semiconductor device, various processes such as photolithography, etching, ashing, ion implantation, thin film deposition and washing are performed on a substrate to form a desired pattern on the substrate. Among these processes, the etching process is a process of removing a selected heating region of a film formed on the substrate, and wet etching and dry etching are used as the etching process. An etching apparatus using plasma is used for the dry etching off these etching processes. In general, in order to form plasma, an electromagnetic field is formed in an internal space of a chamber, and the electromagnetic field excites the process gas provided in the chamber into a plasma state.

The plasma refers to a state of an ionized gas including ions, electrons, radicals and the like. The plasma is generated by a very high temperature, a strong electric field or a RF electromagnetic field. A manufacturing process of a semiconductor device performs an etching process using the plasma. The etching process is performed by the ion particles contained in the plasma colliding with the substrate.

Meanwhile, the chamber includes a substrate processing region on which a substrate support member for supporting the substrate is disposed therein. The substrate processing region may be distinguished from other regions through a dielectric sheet disposed in the chamber. In the substrate processing process using the plasma, the dielectric sheet needs to be maintained at a constant temperature. Therefore, accurate measurement of the dielectric sheet temperature is required during the substrate processing process.

In addition, with miniaturization of the manufacturing process of semiconductor devices, the temperature of a dielectric sheet in a substrate processing apparatus is a factor which may affect a critical dimension of the manufacturing process of the semiconductor device and a profile of a pattern. Therefore, it is important to accurately monitor the temperature change of the dielectric sheet within the substrate processing apparatus in terms of reliability of the manufacturing process of the semiconductor device.

SUMMARY

An aspect of the present inventive concept provides a substrate processing apparatus capable of improving the reliability of the substrate processing process.

Another aspect of the present inventive concept provides a substrate processing apparatus capable of accurately measuring the temperature of the dielectric sheet.

Still another aspect of the present inventive concept provides a substrate processing apparatus in which assembling reproducibility and coupling force between the temperature measurement unit and the dielectric sheet are improved.

Aspects of the present inventive concept are not restricted to those set forth herein. Other aspects that have not been mentioned will become more apparent to one of ordinary skill in the art to which the present inventive concept pertains by referencing the detailed description of the present inventive concept given below.

Specific matters of other embodiments are included in the detailed description and drawings. According to an aspect of the present inventive concept, there is provided a substrate processing apparatus comprising a chamber including a substrate processing region, a dielectric sheet that is disposed on the substrate processing region and includes an insertion hole and a temperature measurement unit that is disposed on the dielectric sheet to measure the temperature of the dielectric sheet, and has a screw portion inserted into the insertion hole, wherein each of the insertion hole and the screw portion has thread helixes meshed with each other.

In some embodiments, a depth of the insertion hole is 80% or less of the thickness of the dielectric sheet.

In some embodiments, the depth of the insertion hole is 10 to 15 mm.

In some embodiments, the thread helix of the screw portion has a length of 4.2 to 20 mm.

In some embodiments, the screw portion comprises three to fourteen screw threads.

In some embodiments, the temperature measurement unit further comprises a first body portion extending from the screw portion, and a ceramic film that wraps the first body portion.

In some embodiments, the ceramic film comprises silicon oxide or aluminum oxide.

In some embodiments, the screw portion has an annularly cylindrical shape and is disposed on a side wall of the first body portion.

In some embodiments, the screw portion comprises silicon oxide or aluminum oxide.

According to an aspect of the present inventive concept, there is provided a substrate processing apparatus comprising a chamber, a dielectric sheet that is disposed within the chamber to divide a substrate processing region and a substrate non-processing region of the chamber, and includes an insertion hole, a substrate support unit that is disposed on the substrate processing region to support the substrate, a plasma generation unit that generates plasma in the substrate processing region and a temperature measurement unit that is disposed on the substrate non-processing region to measure the temperature of the dielectric sheet, and has a screw portion inserted into the insertion hole, wherein each of the insertion hole and the screw portion has thread helixes meshed with each other.

In some embodiments, a depth of the insertion hole is 80% or less of the thickness of the dielectric sheet.

In some embodiments, the depth of the insertion hole is 10 to 15 mm.

In some embodiments, the thread helix of the screw portion has a length of 4.2 to 20 mm.

In some embodiments, the screw portion comprises three to fourteen screw threads.

In some embodiments, the temperature measurement unit further comprises a first body portion, and a ceramic film that wraps the first body portion.

In some embodiments, the screw portion has an annularly cylindrical shape and is disposed on a side wall of the first body portion.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
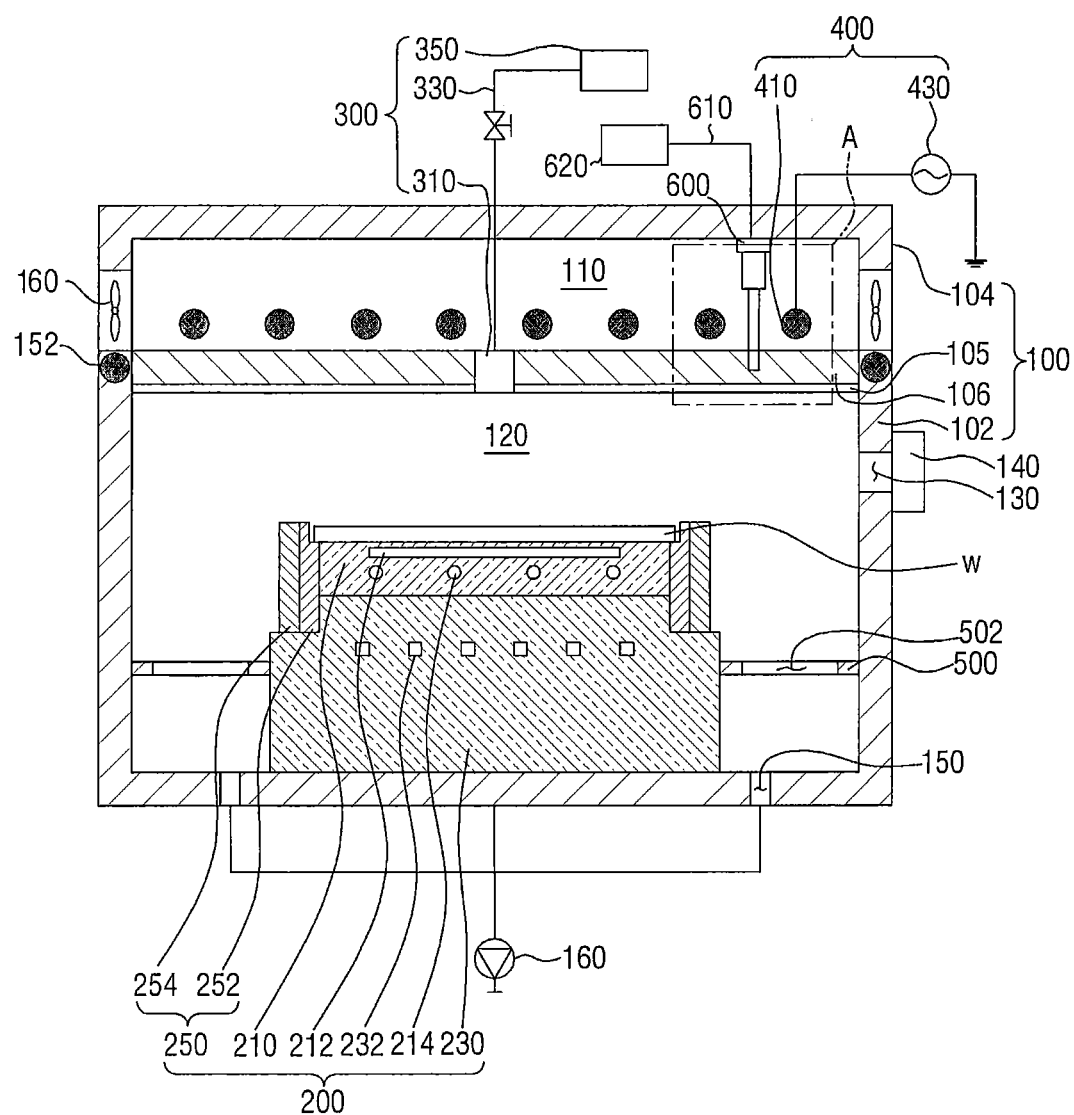
FIG. 1 is a schematic cross-sectional view for illustrating a substrate processing apparatus according to example embodiments of the present inventive concept.

Advantages and features of the present disclosure and methods of accomplishing the same may be understood more readily by reference to the following detailed description of various embodiments and the accompanying drawings. The present disclosure may, however, be embodied in many different forms and should not be construed as being limited to the embodiments set forth herein. Rather, these embodiments are provided so that this disclosure will be thorough and complete and will fully convey the present disclosure to those skilled in the art, and the present inventive concepts will only be defined by the appended claims. Like reference numerals refer to like elements throughout the specification.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises", "comprising,", "includes", "including", "have" and/or "having", and variants thereof when used in this specification, specify the presence of stated features, steps, operations, elements, and/or components, but do not preclude the presence or addition of one or more other features, steps, operations, elements, components, and/or groups thereof.

It will be understood that when an element or layer is referred to as being "on", "connected to" or "coupled to" another element or layer (or variants thereof), it can be directly on, connected or coupled to the other element or layer or intervening elements or layers may be present. In contrast, when an element is referred to as being "directly on", "directly connected to" or "directly coupled to" another element or layer (or variants thereof), there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In embodiments of the present inventive concept, a substrate processing apparatus for etching a substrate using plasma will be described. However, the technical idea of the present inventive concept is not limited thereto, and as long as a substrate processing apparatus requires the temperature measurement, it can be variously applied.

Furthermore, in the embodiments of the present inventive concept, the substrate will be described as a circular wafer as an example. However, the technical idea of the present inventive concept is not limited thereto, and can be applied to wafers of various shapes including a square.

Hereinafter, a substrate processing apparatus according to example embodiments of the present inventive concept will be described with reference to FIGS. 1 to 3.

FIG. 1 is a schematic cross-sectional view for illustrating a substrate processing apparatus according to example embodiments of the present inventive concept. FIG. 2 is a perspective view for illustrating a baffle of FIG. 1. FIG. 3 is a perspective view for illustrating a dielectric sheet and a temperature measurement unit of FIG. 1.

Referring to FIG. 1, the substrate processing apparatus includes a chamber 100, a heating unit 150, a cooling unit 160, a substrate support unit 200, a process gas supply unit 300, a plasma generation unit 400, a baffle 500 and a temperature measurement unit 600.

The chamber 100 may include a substrate processing region 120 in which a substrate W is processed and a substrate non-processing region 110 disposed on the top of the substrate processing region 120. The chamber 100 may have, but is not limited to, a cylindrical shape.

The chamber 100 may include a housing 102, a cover 104, a protective film 105 and a dielectric sheet 106. The housing 102 may have a cylindrical shape with an open top. An opening 130 may be formed on one side wall of the housing 102. The opening 130 may be a passage through which the substrate W can be carried into or out of the housing 102.

The cover 104 may have a cylindrical shape with an open bottom. The cover 104 is coupled to the housing 102 to cover the dielectric sheet 106. The cover 104 coupled to the housing 102 may be in contact with the top of the temperature measurement unit 600. The cover 104 may support the temperature measurement unit 600 disposed between the cover 104 and the dielectric sheet 106 to fix the posture of the temperature measurement unit 600.

Meanwhile, the housing 102 and the cover 104 may be formed of, but is not limited to, a metallic material.

The dielectric sheet 106 may divide an inner space formed by the housing 102 and the cover 104. That is, the dielectric sheet 106 may divide the inner space into a substrate processing region 120 in which the plasma is supplied to process the substrate, and a substrate non-processing region 110, but it is not limited thereto. The dielectric sheet 106 may be disposed on the substrate processing region 120.

The dielectric sheet 106 may be, but is not limited to, a disc shape, and various shapes may be applied in a shape corresponding to the shape of the chamber 100 on which the dielectric sheet is disposed. The dielectric sheet 106 may have a diameter corresponding to the inner diameter of the housing 102.

The dielectric sheet 106 may be located between the housing 102 and the cover 104, but it is not limited thereto, and may be disposed on the inside of the housing 102 or on the inside of the cover 104.

When the dielectric sheet 106 is located between the housing 102 and the cover 104, the substrate processing region 120 may be a region defined by the housing 102 and the dielectric sheet 106, and the substrate non-processing region 110 may be a region defined by the cover 104 and the dielectric sheet 106.

Meanwhile, the dielectric sheet 106 may be formed of a dielectric material. The dielectric sheet 106 may be formed of, but is not limited to, a ceramic material including silicon oxide or aluminum oxide.

A protective film 105 may be disposed on the bottom surface of the dielectric sheet 106. The protective film 105 may prevent damage to the dielectric sheet 106 during the substrate processing process. Further, the protective film 105 may prevent an occurrence of particles in the dielectric sheet 106 during the substrate processing process.

Meanwhile, the protective film 105 may be formed of, but is not limited to, yttrium oxide or the like.

An exhaust hole 150 may be formed on the bottom surface of the chamber 100. The exhaust hole 150 may be connected to a pressure-reducing member 160 through an exhaust line. The pressure-reducing member 160 may provide a vacuum pressure to the exhaust hole 150 through the exhaust line. Byproduct that may be generated during the substrate processing process and plasma remaining in the chamber 100 may be discharged to the outside of the chamber 100 due to a vacuum pressure provided by the pressure-reducing member 160.

The substrate support unit 200 may be disposed in the substrate processing region 120. The substrate support unit 200 may support the substrate W. The substrate support unit 200 may be an electrostatic chuck that supports the substrate W using the electrostatic force. However, the substrate support unit 200 is not limited thereto, and may support the substrate W in various ways such as a mechanical clamping.

When the substrate support unit 200 is an electrostatic chuck, the substrate support unit 200 may include a dielectric layer 210, a focus ring 250 and a base 230. The substrate W may be disposed on the top surface of the dielectric layer 210. In this case, the top surface of the dielectric layer 210 and the substrate W may come into contact with each other. The dielectric layer 210 may be a disc shape. The dielectric layer 210 may have a radius smaller than that of the substrate W.

A lower electrode 212 may be disposed inside the dielectric layer 210. A power source may be connected to the lower electrode 212 and may receive application of the electric power from the power source. The lower electrode 212 may receive provision of the electrostatic force from the electric power so that the substrate W can be absorbed to the dielectric layer 210. Meanwhile, the lower electrode 212 may be a monopolar electrode.

A heater 214 configured to heat the substrate W may be formed inside the dielectric layer 210. The heater 214 may be disposed below the lower electrode 212. The heater 214 may include a spiral coil. Further, the dielectric layer 210 may be formed of a ceramic material.

The base 230 may support the dielectric layer 210. The base 230 is located below the dielectric layer 210 and may be coupled with the dielectric layer 210. The top surface of the base 230 may have a stepped shape so that a central region of the top surface is higher than edge regions. The central region of the top surface of the base 230 may have an area corresponding to the bottom surface of the dielectric layer 210.

A cooling flow passage 232 may be formed inside the base 230. The cooling flow passage 232 may be provided as a passage through which the cooling fluid is circulated. The cooling flow passage 232 may be provided on the inside of the base 230 in a spiral shape.

The base 230 may be connected with a high-frequency power source located on the outside. The high-frequency power source may apply an electric power to the base 230. The electric power applied to the base 230 may guide the plasma generated in the chamber 100 so as to be moved toward the base 230. The base 230 may be formed of a metallic material.

A focus ring 250 may concentrate the plasma to the substrate W. The focus ring 250 may include an inner ring 252 and an outer ring 254. The inner ring 252 may have an annular ring shape that wraps the dielectric layer 210. The inner ring 252 may be disposed in an edge region of the base 230. The top surface of the inner ring 252 may be provided to have the same height as the top surface of the dielectric layer 210. The inner portion of the top surface of the inner ring 252 may support the edge region of the bottom surface of the substrate W. Meanwhile, the inner ring 252 may be formed of, but is not limited to, a conductive material.

The outer ring 254 may have a circular ring shape that wraps the inner ring 252. The outer ring 254 may be disposed adjacent to the inner ring 252 in the edge region of the base 230. The top surface of the outer ring 254 may be disposed to be higher than the top surface of the inner ring 252. Meanwhile, the outer ring 254 may be formed of, but is not limited to, an insulating material.

The gas supply unit 300 may supply a process gas onto the substrate W supported by the substrate support unit 200. The gas supply unit 300 may include a gas storage unit 350, a gas supply line 330 and a gas inlet port 310. The gas storage unit 350 may provide the process gas. The gas supply line 330 may connect the gas storage unit 350 to the gas inlet port 310. Gas supplied by the gas storage unit 350 may be supplied to the gas inlet port 310 through the gas supply line 330.

Meanwhile, a valve may be installed on the gas supply line 330. The valve may open and close the supply passage of the process gas. Meanwhile, when the substrate processing apparatus according to this embodiment is a substrate etching apparatus, the process gas may be, but is not limited to, an etching gas.

The plasma generation unit 400 may excite the process gas in the chamber 100 into a plasma state. The plasma generation unit 400 may be an inductively coupled plasma generation unit. The plasma generation unit 400 may include an antenna 410 and an external power source 430.

The antenna 410 may be disposed in the substrate non-processing region 110. The antenna 410 may be provided in a spiral shape which is wound for a plurality number of times at the same height, and may be connected to the external power source 430. The antenna 410 may receive application of electric power from the external power source 430. The antenna 410 applied with the electric power may form a discharge space in the substrate processing region 120. The process gas remaining within the substrate processing region 120 formed with the discharge space may be excited in a plasma state.

The baffle 500 allows the plasma to be uniformly exhausted for each region in the substrate processing region 120.

Figure 2:
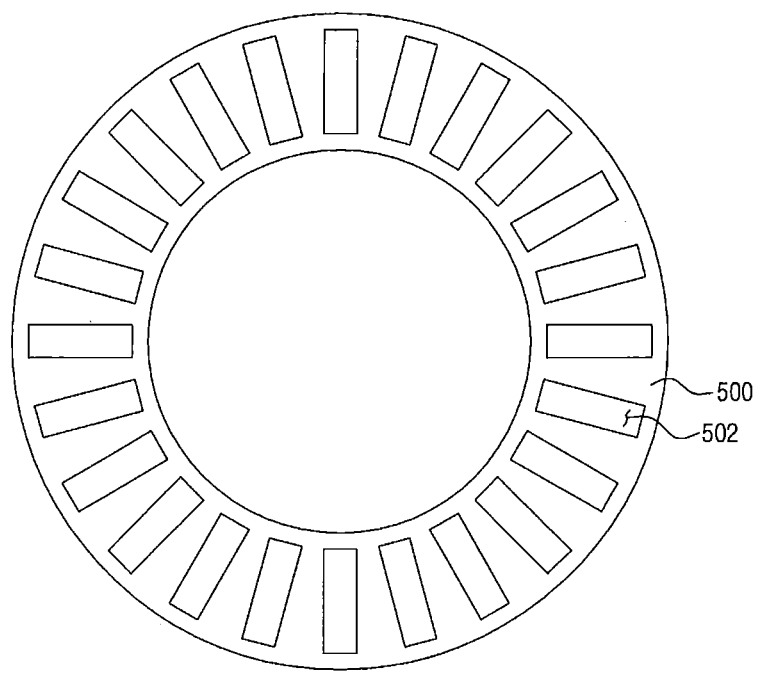
FIG. 2 is a perspective view for illustrating a baffle of FIG. 1.

Referring to FIG. 2, the baffle 500 may be disposed between the inner wall of the chamber 100 and the substrate support unit 200 in the processing region 120. The baffle 500 may have, but is not limited to, an annular ring shape. Thus, the baffle 500 may include various shapes corresponding to the shape of the disposed region.

A plurality of through-holes 502 may be formed on the baffle 500. The through-holes 502 may be provided in a vertical direction. The through-holes 502 may be provided along a circumferential direction of the baffle 500. Through-holes 502 may have a slit shape. The through-holes 502 may have a length direction directed toward a radial direction of the baffle 500.

The heating unit 152 may be disposed on both sides of the dielectric sheet 106. The heating unit 152 may heat the edge region of the dielectric sheet 106. In this embodiment, although the heating unit 152 is illustrated as being disposed on both sides of the dielectric sheet 108, the technical idea of the present inventive concept is not limited thereto. Thus, the heating unit 152 may be disposed at any location without limitation, as long as it can heat the dielectric sheet 106.

Meanwhile, the heating unit 152 may be connected to a temperature control device that is disposed on the outside. The temperature control device may control the heating unit 152 so that the temperature of the dielectric sheet 106 changes depending on the process states. Thus, the temperature control device may include, but is not limited to, a power source for supplying the power to the heating unit 152, and a control unit that controls heat supplied to the dielectric sheet 106 by the heating unit 152.

Meanwhile, the heating unit 152 may send and receive electrical signals to and from the temperature measurement unit 600 through the temperature control device. That is, when the temperature of the dielectric sheet 106 is measured through the temperature measurement unit 600, the heating unit 152 may be controlled through the temperature control device based on the measured temperature. However, the technical idea of the present inventive concept is not limited thereto, and another additional configuration may be connected to the temperature measurement unit 600.

The cooling unit 160 may prevent the temperature of the dielectric sheet 106 from overheating. The cooling unit 160 may include a fan disposed on the side wall of the cover 104. The fan may form an air flow in the non-processing region 110 of the substrate to prevent the dielectric sheet 106 from being heated. Meanwhile, the air flow formed by the fan may transfer the temperature of the edge region of the dielectric sheet 106 to the central region of the dielectric sheet 106. Meanwhile, the cooling unit 160 may further include an external power source that supplies the power source to the fan.

Meanwhile, the heating unit 152 and the cooling unit 160 may interact through a separate control unit to control the temperature of the dielectric sheet 106.

The temperature measurement unit 600 may be disposed between the dielectric sheet 106 and the cover 104. The temperature measurement unit 600 may be disposed in the substrate non-processing region 110. The temperature measurement unit 600 may have, but is not limited to, an elongated cylindrical shape that vertically extends.

Meanwhile, the temperature measurement unit 600 may be formed of a metallic material.

Temperature measured by the temperature measurement unit 600 may be transmitted to a measurement temperature storage unit 620 through a measurement line 610. Meanwhile, the measurement temperature storage unit 620 may be electrically connected to the cooling unit 160 and/or the heating unit 152, and may interact through control of the specific control unit, but it is not limited thereto.

In the present inventive concept, a part of the temperature measurement unit 600 may be disposed inside the dielectric sheet 106, and the temperature of the dielectric sheet 106 may be measured using a part of the temperature measurement unit 600 disposed within the dielectric sheet 106. Accordingly, the temperature measurement unit 600 may more accurately measure the temperature.

More specifically, when the temperature measurement unit 600 measures the temperature of the dielectric sheet 106 in contact with the surface of the dielectric sheet 106, it may be difficult to accurately measure the temperature of the dielectric sheet 106, due to pressure applied to the temperature measurement unit 600 at the time of temperature measurement, the air flow of the fan included in the cooling unit 160, or the like.

That is, when the pressure applied to the temperature measurement unit 600 is relatively high, the temperature of the dielectric sheet 106 may be measured to be high. Further, at the time of temperature measurement, when the air flow of the fan of the cooling unit 160 instantaneously changes, the temperature of the dielectric sheet 106 may also instantaneously change.

Therefore, when measuring the temperature of the dielectric sheet 106 on the surface of the dielectric sheet 106, since the accuracy of the temperature measurement may drop due to various variables, the reliability of measured temperature may drop. Also, when there is a plurality of chambers, there also may be a problem of the temperature of the dielectric sheet 106 being differently measured due to the various variables described above.

However, in the temperature measurement unit 600 according to this embodiment, since a part of the temperature measurement unit 600 is disposed inside the dielectric sheet 106 to measure the temperature of the dielectric sheet 106, it is possible to block the distortion of the temperature due to the various variables, and thus, it is possible to more accurately measure the temperature. Therefore, the reliability of the measured temperature of the temperature measurement unit 600 may be improved.

Since the substrate processing apparatus may be controlled or operated on the basis of the temperature measured from the temperature measurement unit 600, the substrate processing apparatus according to the present embodiment may perform the substrate processing process with improved reliability.

A schematic arrangement relation between the dielectric sheet 106 and the temperature measurement unit 600 will be described using FIG. 3.

Figure 3:
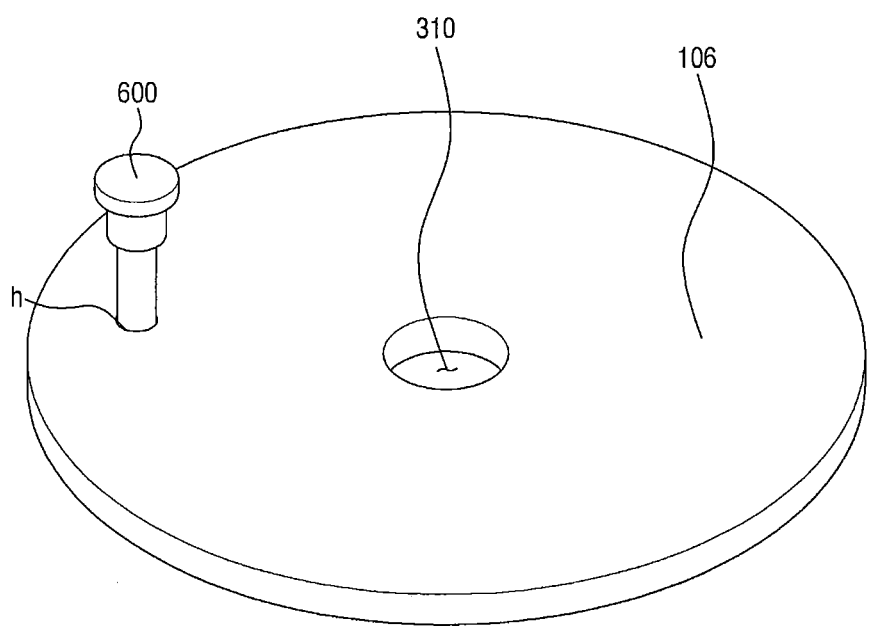
FIG. 3 is a perspective view for illustrating a dielectric sheet and a temperature measurement unit of FIG. 1.

Referring to FIG. 3, the dielectric sheet 106 includes an aperture or insertion hole h, and a part of the temperature measurement unit 600 may be disposed inside the insertion hole h. In this embodiment, although arrangement of one insertion hole is illustrated, the technical idea of the present inventive concept is not limited thereto. Therefore, a plurality of insertion holes h may be disposed as needed. Further, the insertion holes h may be formed at any position without limitation, as long as the temperature of the dielectric sheet 106 can be measured.

Next, a substrate processing apparatus according to example embodiments of the present inventive concept will be described referring to FIGS. 4 to 6.

Figures 4A, 4B:
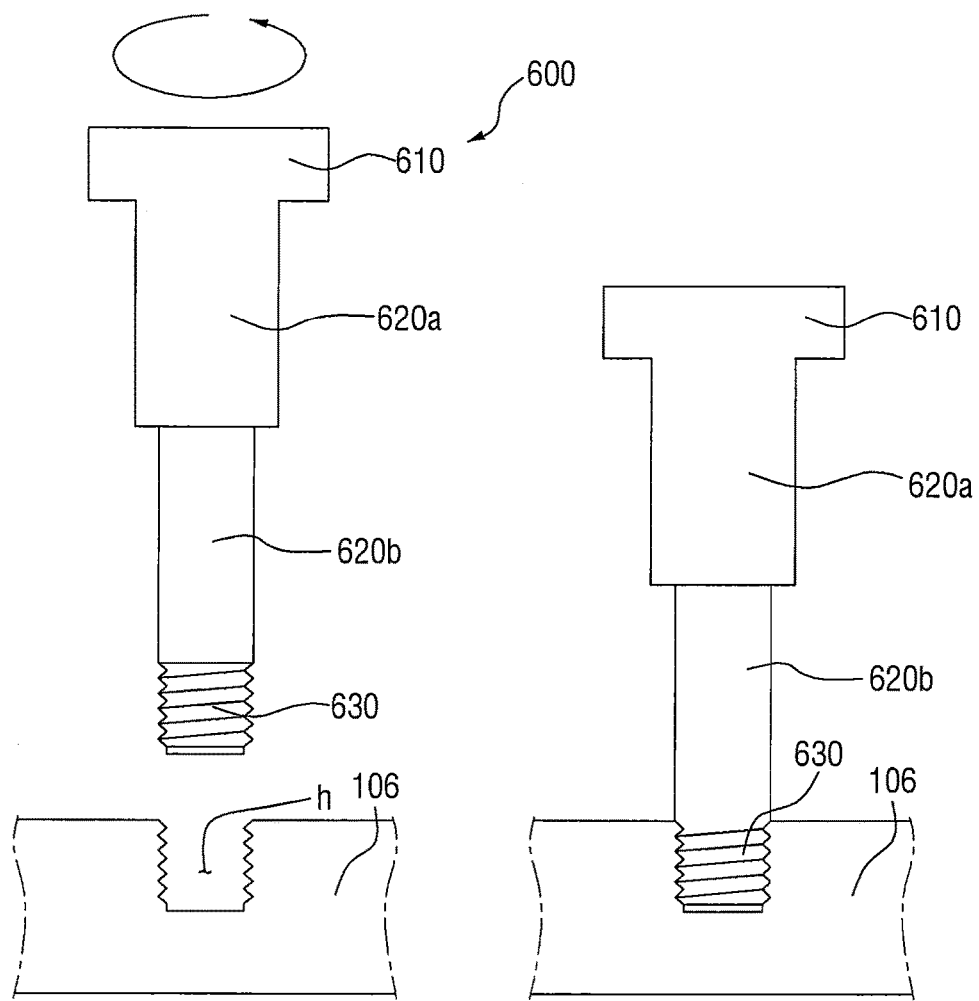
FIGS. 4(a) and 4(b) are cross-sectional views of a partial region of the substrate processing apparatus according to example embodiments of the present inventive concept.

FIGS. 4(a) and 4(b) are cross-sectional views of a partial region of the substrate processing apparatus according to example embodiments of the present inventive concept. FIG. 5 is a cross-sectional view of a partial region of the substrate processing apparatus according to example embodiments of the present inventive concept. FIG. 6 is a cross-sectional view of a temperature measurement unit 600 included in the substrate processing apparatus according to example embodiments of the present inventive concept.

The substrate processing apparatus according to this embodiment is substantially the same as the substrate processing apparatus described through FIGS. 1 to 3. Therefore, the same reference numerals refer to the same components, and accordingly, the repeated description of the same components may be omitted.

FIGS. 4(a) to 6 are for detailed description of the temperature measurement unit 600 that is included in the substrate processing apparatus according to this embodiment.

First, a configuration of the temperature measurement unit 600, and a coupling process of the temperature measurement unit 600 and the dielectric sheet 106 will be described in more detail with reference to FIGS. 4(a) and 4(b). FIG. 4(a) is a cross-sectional view before the temperature measurement unit 600 and the dielectric sheet 106 are coupled to each other, and FIG. 4(b) is a cross-sectional view after the temperature measurement unit 600 and the dielectric sheet 106 are coupled to each other.

Referring to FIG. 4, the temperature measurement unit 600 may include a threaded or screw portion 630, a first body portion 620b, a second body portion 620a and a head portion 610.

The screw portion 630 may detect the temperature of the dielectric sheet 106. The screw portion 630 may detect the temperature of the dielectric sheet 106 through contact between the lower surface of the screw portion 630 and the bottom surface of the insertion hole h of the dielectric sheet 106.

The screw portion 630 may include a thread helix, and may be a male screw including a thread helix on the outer circumferential surface. The screw portion 630 may have a shape extending from the first body portion 620b. The second body portion 620a may be disposed on the first body portion 620b. The second body portion 620a may have a shape extending from the first body portion 620b. The widths of the first body portion 620b and the second body portion 620a may be different from one another, but it is not limited thereto.

The insertion hole h of the dielectric sheet 106 may include a thread helix on the inner peripheral surface, and the thread helix included in the insert hole h may be meshed with the thread helix of the screw portion 630. The temperature measurement unit 600 may be rotated and inserted into the insertion hole h of the rotating dielectric sheet 106.

In the embodiments of the present inventive concept, each of the temperature measurement unit 600 and the dielectric sheet 106 has the thread helixes, and the thread helixes may be meshed with each other. Therefore, as compared to a case where the temperature measurement unit 600 is simply in contact with the surface of the dielectric sheet 106, the temperature measurement unit 600 and the dielectric sheet 106 according to this embodiment may be more strongly coupled to each other. Therefore, even when the vibration and shock of the substrate processing apparatus occur, the temperature measurement unit 600 according to this embodiment may stably maintain coupling with the dielectric sheet 106. Thus, the temperature measurement unit 600 may accurately measure the temperature of the dielectric sheet 106.

Further, since the temperature measurement unit 600 and the dielectric sheet 106 are coupled to each other through the respective screw threads, as compared to a case where there is no screw thread, it is possible to effectively block outside air from entering the insertion hole h of the dielectric sheet 106. Thus, the reliability of the temperature measurement may be improved.

Since the temperature measurement unit 600 is inserted into the insertion hole h formed at a certain depth to measure the temperature, it is possible to more accurately measure the temperature of the lower surface of the dielectric sheet 106 adjacent to the substrate processing region 120.

Next, the temperature measurement unit included in the substrate processing apparatus according to an embodiment of the present inventive concept will be described in more detail referring to FIG. 5.

Figure 5:
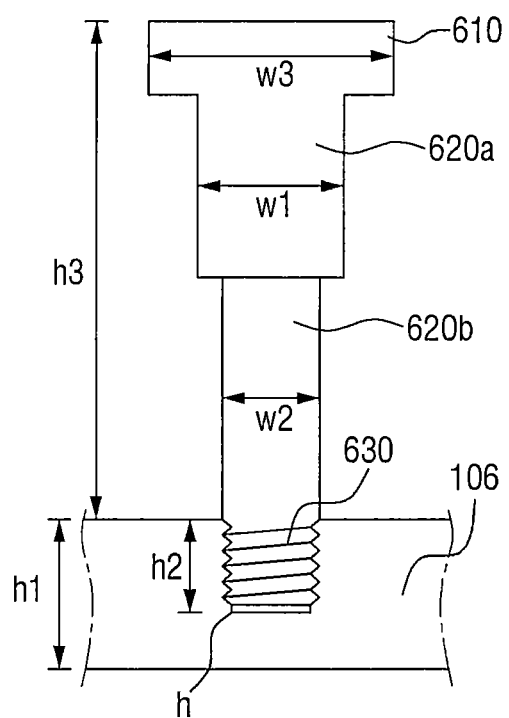
FIG. 5 is a cross-sectional view of a partial region of the substrate processing apparatus according to example embodiments of the present inventive concept.

Referring to FIG. 5, the dielectric sheet 106 may have a thickness of a first length h1. The screw portion 630 may have a length of a second length h2. The insertion hole h may have a depth of the second length h2. Meanwhile, the lengths of the screw portion 630 and the insertion hole h are illustrated as the same second length h2, but it is not limited thereto. Therefore, the lengths of the screw portion 630 and the insertion hole h may be different from each other.

The total length of first and second body portions 620b, 620a and the head portion 610 may be a length corresponding to a third length h3. Therefore, the temperature measurement unit 600 may have a length obtained by adding up the second length h2 and the third length h3.

The second length h2 may have a length of 80% or less of the first length h1. That is, the depth h2 of the insertion hole h may be a length of 80% or less of the thickness h1 of the dielectric sheet 106. When the second length h2 has the length of 80% or less of the first length h1, it is possible to prevent an occurrence of crack and breakage of the dielectric sheet 106. Meanwhile, in this embodiment, the depth of the insertion hole h may be 10 to 15 mm. The screw portion 630 will be described later in more detail.

Meanwhile, the head portion 610 may have a third width w3. The second body portion 620a may have a first width w1. The first body portion 620b may have a second width w2.

The head portion 610 may be in contact with the cover 104 of the chamber 100. Since the posture of temperature measurement unit 600 may be fixed through the contact, the third width w3 as the width of the head portion 610 may be greater than the first and second widths w1, w2. However, it is not limited thereto.

Meanwhile, the first width w1 is illustrated as being greater than the second width w2, but the technical idea of the present inventive concept is not limited thereto. Therefore, the first width w1 may be greater than the second width w2 or equal to the second width w2.

Next, the screw portion of the temperature measurement unit included in the substrate processing apparatus according to an embodiment of the inventive concept will be described in more detail referring to FIG. 6.

Figure 6:
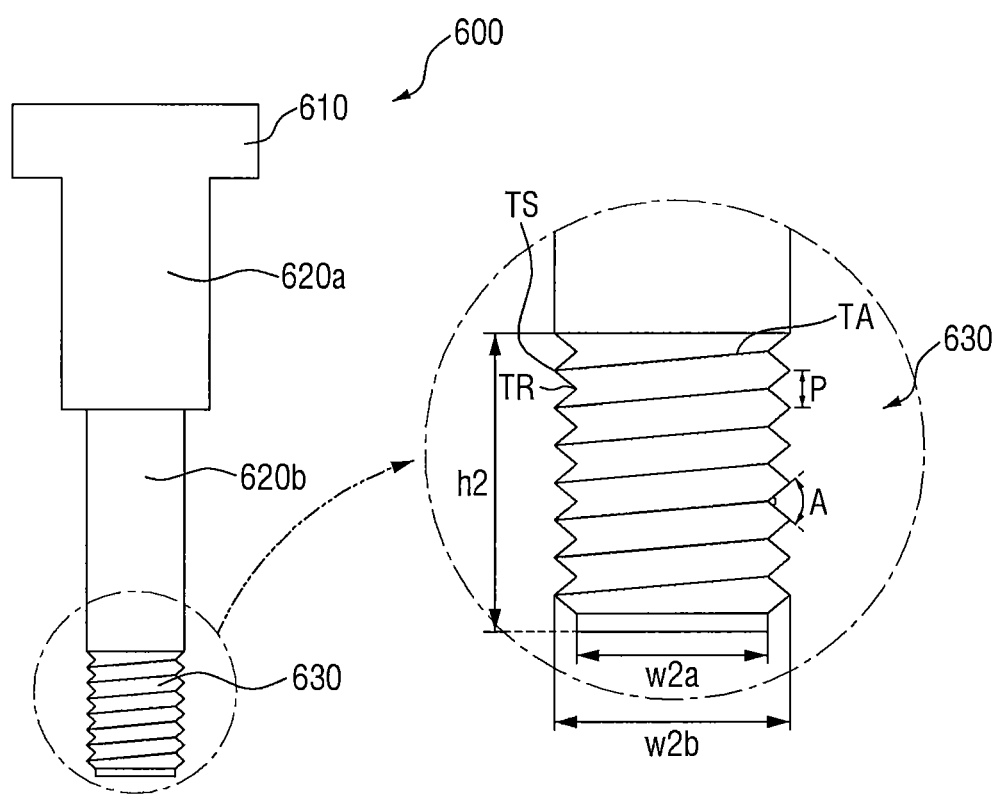
FIG. 6 is a cross-sectional view of a temperature measurement unit included in the substrate processing apparatus according to example embodiments of the present inventive concept.

Referring to FIG. 6, the screw portion 630 of the temperature measurement unit 600 may have a length corresponding to the second length h2. The screw portion 630 includes a screw thread TS, a thread root TR and a thread helix TA. Further, the screw portion 630 may include a thread root width w2a and a screw thread width w2b.

In this embodiment, the length of the thread helix TA may be 4.2 mm to 20 mm. When the length of the screw TA is within the above-described range, the temperature measurement unit 600 has a stable fastening force with the dielectric sheet 106, and may be inserted into the insertion hole h of the dielectric sheet 106 over a certain depth to measure an accurate temperature. However, it is not limited thereto.

Further, in this embodiment, the number of screw threads TS which appear on the cross-section of the temperature measurement unit 600 may be three to fourteen. When the number of the screw threads TS is within the above-described range, the temperature measurement unit 600 has an appropriate fastening force with the dielectric sheet 106, blocks inflow of the outside air, and may be inserted into the insertion hole h of the dielectric sheet 106 to accurately measure the temperature over a certain depth. However, it is not limited thereto.

Meanwhile, in this embodiment, when the length of the thread helix TA is 4.2 mm, the number of screw threads TS may be three, and when the length of the thread helix TA is 20 mm, the number of screw threads TS may be fourteen, but they are not limited thereto.

Meanwhile, the screw portion 630 illustrated in FIG. 6 is illustrated on the assumption that the length of the thread helix TA is 10 mm and the number of screw threads TS is seven, but the technical idea of the present inventive concept is not limited thereto. Meanwhile, when the length of the thread helix TA of the screw portion 630 is 10 mm, and the number of the screw threads TS is seven, a pitch P may be 1.4 mm, and a screw thread angle A may be 60°.

Meanwhile, a root diameter w2a may be 10 to 20 mm, and an outer diameter w2b may be 10 to 20 mm. However, it is not limited thereto. The size of the outside diameter w2b may correspond to the diameter of the insertion hole h of the dielectric sheet 106.

Meanwhile, in this embodiment, the screw portion 630 may be a right-hand screw or a left-hand screw.

In this embodiment, although the screw portion 630 is illustrated as a case of a triangular screw in which the form of the screw threads TS is triangular, the present inventive concept is not limited thereto, and the screw portion 630 may be a square screw, a trapezoidal screw, a serrated screw or a rounded screw.

Further, in this embodiment, the screw portion 630 is illustrated as one row screw having a thread helix TA of one row, but it is not limited thereto, and the screw portion 630 may be a multiple row screw.

Next, a substrate processing apparatus according to example embodiments of the present inventive concept will be described referring to FIG. 7.

Figure 7:
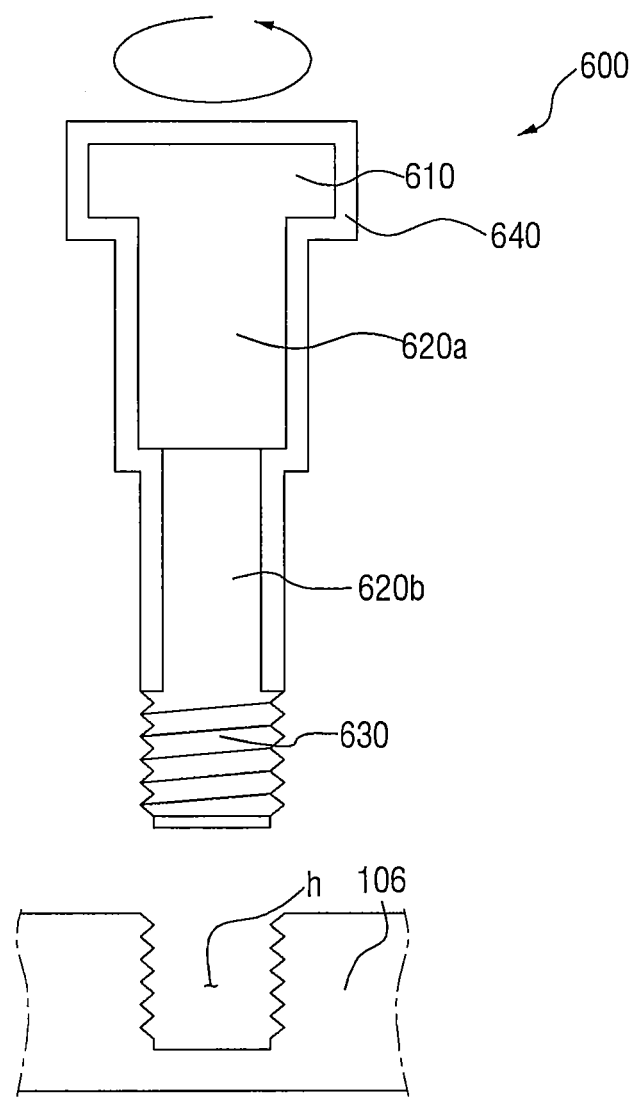
FIG. 7 is a cross-sectional view of a partial region of the substrate processing apparatus according to example embodiments of the present inventive concept.

FIG. 7 is a cross-sectional view of a partial region of the substrate processing apparatus according to example embodiments of the present inventive concept.

The substrate processing apparatus according to this embodiment is substantially the same as the substrate processing apparatus described through FIGS. 4 to 6, except for further including a ceramic film that wraps the surface of the temperature measurement unit. Therefore, the same reference numerals refer to the same configurations, and thus; the repeated description of the same configuration may be omitted.

Referring to FIG. 7, the temperature measurement unit 600 may further include a ceramic film 640 that wraps a part of the surface of the temperature measurement unit 600.

The ceramic film 640 may wrap the surfaces of the first body portion 620b, the second body portion 620a and the head portion 610, except for the screw portion 630.

The ceramic film 640 may include the same material as the dielectric sheet 106. The ceramic film 640 may be formed of a dielectric material. The ceramic film 640 may include a ceramic including silicon oxide and aluminum oxide.

Since the temperature measurement unit 600 is wrapped with the insulating ceramic film 640, the temperature measurement unit 600 may be protected from the outside environment, and it is possible to minimize a difference in thermal expansion coefficient due to a difference in the material that constitutes the temperature measurement unit 600 and the dielectric sheet 106.

Next, a substrate processing apparatus according to example embodiments of the present inventive concept will be described referring to FIGS. 8(*a*) and 8(*b*).

Figure 8A:
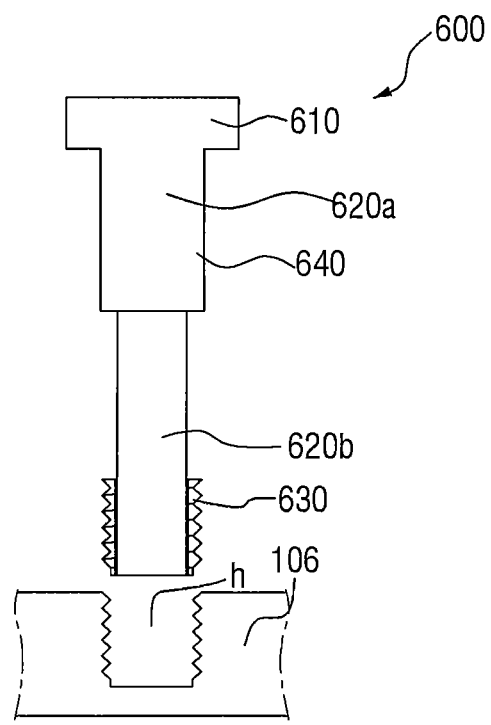
FIG. 8(a) is a cross-sectional view illustrating a region of the substrate processing apparatus according to example embodiments of the present inventive concept.
Figure 8B:
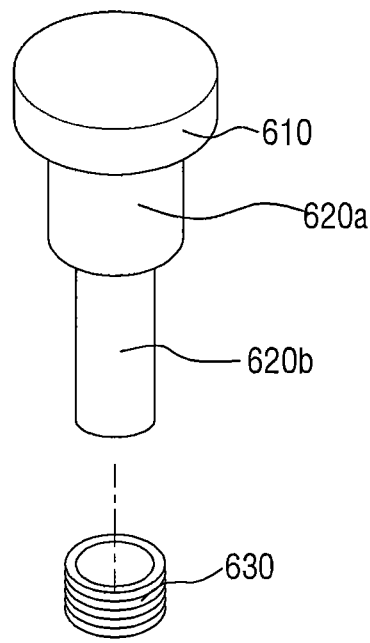
FIG. 8(b) is a perspective view for illustrating the temperature measurement unit of the substrate processing apparatus according to example embodiments of the present inventive concept.

FIGS. 8(*a*) and 8(*b*) are a cross-sectional view and a perspective view for illustrating a substrate processing apparatus according to example embodiments of the present inventive concept. FIG. 8(*a*) is a cross-sectional view illustrating a region of the substrate processing apparatus according to example embodiments of the present inventive concept, and FIG. 8(*b*) is a perspective view for illustrating the temperature measurement unit of the substrate processing apparatus according to example embodiments of the present inventive concept.

The substrate processing apparatus according to this embodiment is substantially the same as the substrate processing apparatus described through FIGS. 4 to 6, except that the screw portion is separable from the temperature measurement unit. Therefore, the same reference numerals refer to the same components, and thus, the repeated description of the same component may be omitted.

Referring to FIG. 8, the temperature measurement unit 600 includes a screw portion 630 disposed on a sidewall of a first body portion 620b. The screw portion 630 may have an annularly cylindrical shape that can be inserted into the lower end region of the first body portion 620b. Therefore, the screw portion 630 allows insertion and removal of the first body portion 620b.

Meanwhile, in this embodiment, the screw portion 630 may include the same material as the dielectric sheet 106. The screw portion 630 may be formed of a dielectric material. The screw portion 630 may include a ceramic that includes silicon oxide and aluminum oxide.

In this embodiment, since the temperature measurement unit 600 includes the detachable screw portion 630, it is possible to freely use the screw portion 630 having a length that matches the depth the insertion hole h of the dielectric sheet 106 into which the temperature measurement unit 600 can be inserted.

Next, a substrate processing apparatus according to example embodiments of the present inventive concept will be described referring to FIGS. 9(*a*) and 9(*b*).

Figure 9A:
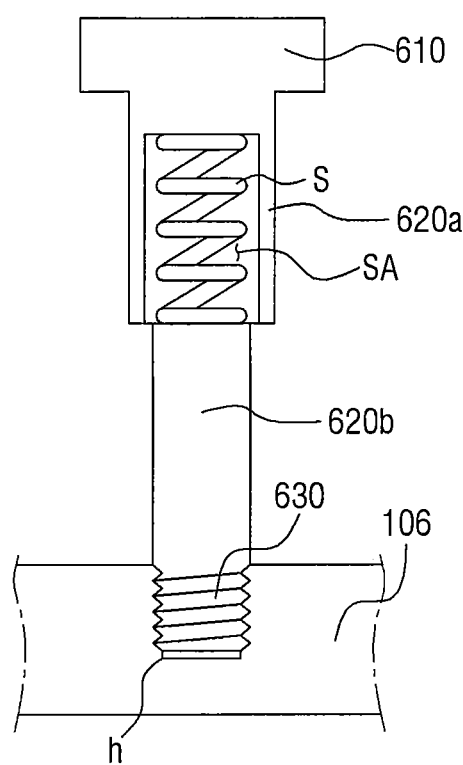
FIGS. 9(a) and 9(b) are cross-sectional views of a partial region of the substrate processing apparatus according to example embodiments of the present inventive concept.
Figure 9B:
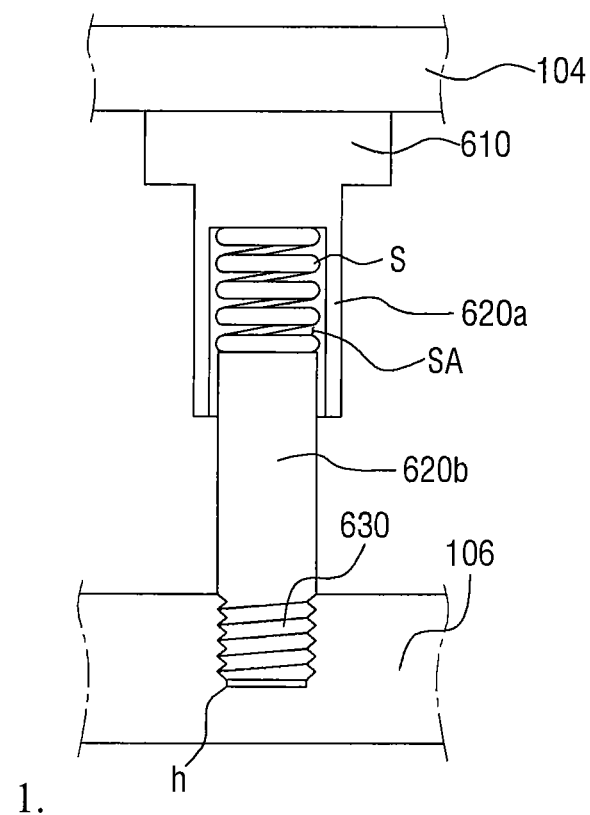

FIGS. 9(*a*) and 9(*b*) are cross-sectional views of a partial region of the substrate processing apparatus according to example embodiments of the present inventive concept. FIG. 9(*a*) is a cross-sectional view for illustrating a spring of the temperature measurement unit that is included in the substrate processing apparatus according to example embodiments of the present inventive concept, and FIG. 9(*b*) is a cross-sectional view for illustrating a compressed state of the spring of the temperature measurement unit included in the substrate processing apparatus according to example embodiments of the present inventive concept.

The substrate processing apparatus according to this embodiment is substantially the same as the substrate processing apparatus described through FIGS. 4 to 6, except that a spring is disposed within a second body portion, and a first body portion can be inserted into the second body portion. Therefore, the same reference numerals refer to same components, and thus, the repeated description of the same components may be omitted.

Referring to FIG. 9, the temperature measurement unit 600 may include a spring S. Specifically, the temperature measurement unit 600 may include a spring arrangement region SA within the second body portion 620a. The spring arrangement region SA may have a hollow or concave shape having an opening region at the bottom.

As long as the spring S may be disposed within the spring arrangement area SA, the top of the spring S may be supported on the top surface of the spring arrangement region SA, and the bottom of the spring S may be supported on the top surface of the first body portion 620b.

Therefore, when the pressure is applied to the head portion 610, the spring S is compressed, and a part of the upper end region of the first body portion 620b may be disposed within the spring arrangement region SA of the second body portion 620a. As such, the first and second body portions 620b, 620a have a movable telescoping relationship relative to each other.

More specifically, when the cover 104 is disposed in a state in which the screw portion 630 of the temperature measurement unit 600 is inserted into the insertion hole h of the dielectric sheet 106, the cover 104 applies pressure to the head portion 610 and the spring S is compressed. Thus, a part of the upper end region of the first body portion 620b is inserted into the spring arrangement region SA of the second body portion 620a; the length of the temperature measurement unit 600 may be reduced. That is, in this embodiment, the first body portion and 620b and the second body portion 620a may be separated from each other.

In this embodiment, since the temperature measurement unit 600 includes the spring S, when the cover 104 of the chamber 100 is closed, the temperature measurement unit 600 may maintain a stable posture due to the elastic force of the spring S. Therefore, even when there is impact or vibration during the substrate processing process, since the temperature measurement unit 600 maintains a stable posture, the reliability of the temperature measurement of the substrate processing apparatus can be improved.

Next, a substrate processing apparatus according to example embodiments of the present inventive concept will be described referring to FIG. 10.

Figure 10:
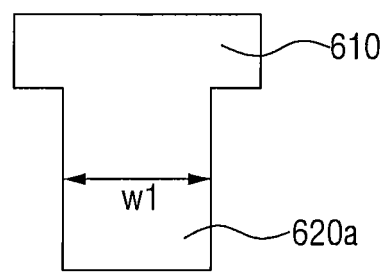
FIG. 10 is a cross-sectional view of a partial region of the substrate processing apparatus according to example embodiments of the present inventive concept.
Figure 10:
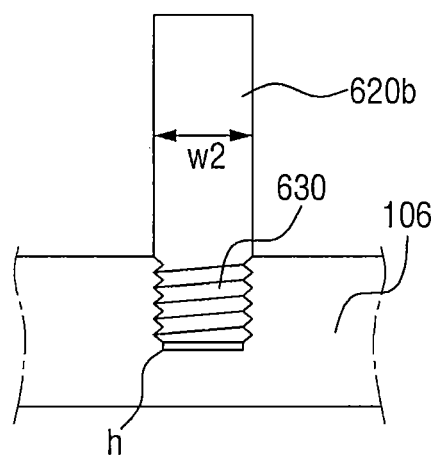

FIG. 10 is a cross-sectional view of a partial region of the substrate processing apparatus according to example embodiments of the present inventive concept.

The substrate processing apparatus according to this embodiment is substantially the same as the substrate processing apparatus described through FIGS. 4 to 6, except that the first body portion and the second body portion of the temperature measuring portion can be separated from each other. Therefore, the same reference numerals refer to the same components, and the repeated description of the same components may be omitted.

Referring to FIG. 10, a first body portion 620b and a second body portion 620a of the temperature measurement unit 600 may be separated from each other. A width w1 of the second body portion 620a may be greater than a width w2 of the first body portion 620b. Thus, the second body portion 620a may be stably disposed on the first body portion 620b.

In this embodiment, since the first body portion 620*b* and the second body portion 620*a* of the temperature measurement unit 600 may be separated from each other, it is possible to freely remove the second body portion 620*a* and the head portion 610, while fixing the first body portion 620*b* and the screw portion 630 to the dielectric sheet 106.

That is, by coupling the second body portion 620*a* only when the temperature measurement of the dielectric sheet 106 is required without disposing the overall configuration of the temperature measurement unit 600 at all times, the temperature can be measured. Further, since the first body portion 620*b* and the screw portion 630 are disposed in a plurality of chambers at all times, and the temperature of the dielectric sheet 106 can be measured by alternately coupling a single second body portion 620*a* with the first body portion 620*b*, it is more economical.

Next, a substrate processing apparatus according to example embodiments of the present inventive concept will be described referring to FIG. 11.

Figure 11:
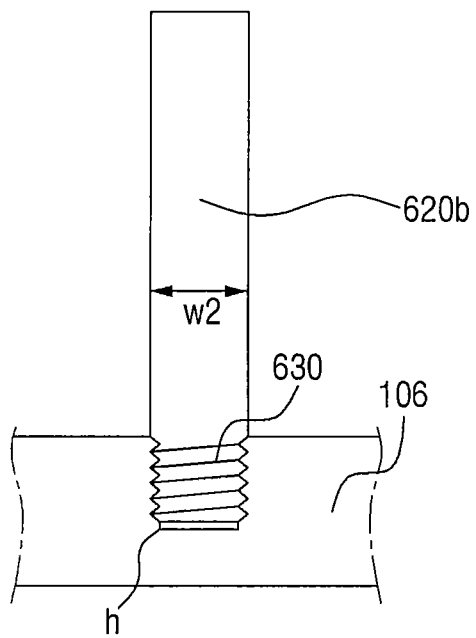
FIG. 11 is a cross-sectional view of a partial region of the substrate processing apparatus according to example embodiments of the present inventive concept.

FIG. 11 is a cross-sectional view of a partial region of the substrate processing apparatus according to example embodiments of the present inventive concept.

The substrate processing apparatus according to this embodiment is substantially the same as the substrate processing apparatus described through FIGS. 4 to 6, except that the temperature measurement unit does not include a second body portion and a head portion. Therefore, the same reference numerals refer to the same components, and the repeated description of the same components may be omitted.

Referring to FIG. 11, the temperature measurement unit 600 includes a screw portion 630 and a first body portion 620*b*.

The temperature measurement unit 600 according to this embodiment has a simple configuration that does not include a second body portion and a head portion, as compared to the temperature measurement unit 600 according to other embodiments.

Next, a substrate processing apparatus according to example embodiment of the present inventive concept will be described referring to FIG. 12.

Figure 12:
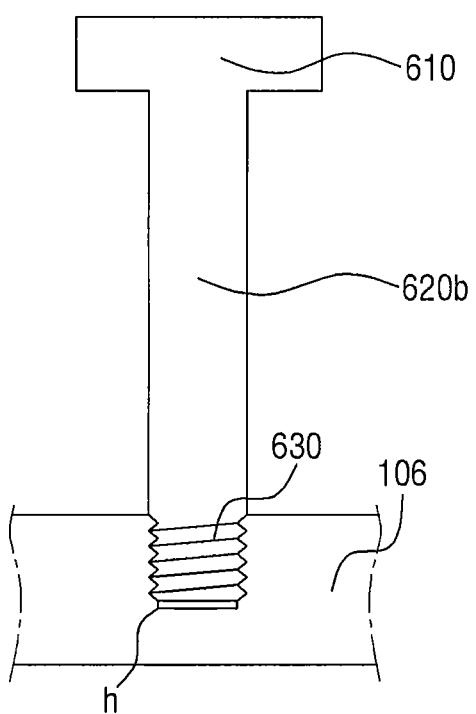
FIG. 12 is a cross-sectional view of a partial region of the substrate processing apparatus according to example embodiment of the present inventive concept.

FIG. 12 is a cross-sectional view of a partial region of the substrate processing apparatus according to example embodiment of the present inventive concept.

The substrate processing apparatus according to this embodiment is substantially the same as the substrate processing apparatus described through FIGS. 4 to 6, except that the temperature measurement unit does not include a second body portion. Therefore, the same components refer to the reference numerals, and the repeated description of the same components may be omitted.

Referring to FIG. 11, the temperature measurement unit 600 includes a screw portion 630, a first body portion 620*b* and a head portion 610.

The temperature measurement unit 600 according to this embodiment has a T-shaped simple form, as compared to the temperature measurement unit 600 according to other embodiments.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A substrate processing apparatus, comprising:
   a chamber including a substrate processing region;
   a dielectric sheet disposed above the substrate processing region, wherein the dielectric sheet comprises an insertion hole having a bottom surface; and
   a temperature measurement unit comprising a screw portion having a lower surface, wherein the screw portion is inserted into the insertion hole such that the lower surface of the screw portion contacts the bottom surface of the insertion hole, wherein the screw portion detects a temperature of the dielectric sheet through contact between the lower surface of the screw portion and the bottom surface of the insertion hole, and wherein each of the insertion hole and the screw portion has thread helixes meshed with each other.

2. The substrate processing apparatus of claim 1, wherein a depth of the insertion hole is 80% or less of a thickness of the dielectric sheet.

3. The substrate processing apparatus of claim 2, wherein the depth of the insertion hole is 10 to 15 mm.

4. The substrate processing apparatus of claim 2, wherein the thread helix of the screw portion has a length of 4.2 to 20 mm.

5. The substrate processing apparatus of claim 2, wherein the screw portion comprises three to fourteen screw threads.

6. The substrate processing apparatus of claim 1, wherein the temperature measurement unit further comprises a first body portion extending from the screw portion, and a ceramic film that wraps the first body portion.

7. The substrate processing apparatus of claim 6, wherein the ceramic film comprises silicon oxide or aluminum oxide.

8. The substrate processing apparatus of claim 1, wherein the temperature measurement unit further comprises a first body portion extending from the screw portion, and wherein the screw portion has a cylindrical shape and is disposed on a side wall of the first body portion.

9. The substrate processing apparatus of claim 8, wherein the screw portion comprises silicon oxide or aluminum oxide.

10. A substrate processing apparatus, comprising:
    a chamber;
    a dielectric sheet disposed within the chamber to divide a substrate processing region and a substrate non-processing region of the chamber, wherein the dielectric sheet comprises an insertion hole having a bottom surface;
    a substrate support unit disposed within the substrate processing region to support a substrate;
    a plasma generation unit that generates plasma in the substrate processing region; and
    a temperature measurement unit within the substrate non-processing region that is configured to measure a temperature of the dielectric sheet, wherein the temperature measurement unit comprises a screw portion having a lower surface, wherein the screw portion is inserted into the insertion hole such that the lower surface of the screw portion contacts the bottom surface of the insertion hole, wherein the screw portion detects a temperature of the dielectric sheet through contact between the lower surface of the screw portion and the bottom surface of the insertion hole, and wherein each of the insertion hole and the screw portion has thread helixes meshed with each other.

11. The substrate processing apparatus of claim 10, wherein a depth of the insertion hole is 80% or less of a thickness of the dielectric sheet.

12. The substrate processing apparatus of claim 11, wherein the depth of the insertion hole is 10 to 15 mm.

13. The substrate processing apparatus of claim 11, wherein the thread helix of the screw portion has a length of 4.2 to 20 mm.

14. The substrate processing apparatus of claim 11, wherein the screw portion comprises three to fourteen screw threads.

15. The substrate processing apparatus of claim 10, wherein the temperature measurement unit further comprises a first body portion, and wherein the screw portion has a cylindrical shape and is disposed on a side wall of the first body portion.

16. A substrate processing apparatus, comprising:
a chamber;
a dielectric sheet disposed within the chamber that divides the chamber into a substrate processing region and a substrate non-processing region; and
a temperature measurement unit comprising a threaded portion that is threadingly secured within an aperture in the dielectric sheet, wherein the aperture comprises a bottom surface and wherein the threaded portion comprises a lower surface, wherein the threaded portion is threadingly secured within the aperture such that the lower surface of the threaded portion contacts the bottom surface of the aperture, and wherein a temperature of the dielectric sheet is measured through contact between the lower surface of the threaded portion and the bottom surface of the aperture.

17. The substrate processing apparatus of claim 16, wherein the temperature measurement unit is positioned within the substrate non-processing region.

18. The substrate processing apparatus of claim 16, wherein the chamber comprises a housing and a cover coupled to the housing, and wherein the cover contacts a top portion of the temperature measurement unit.

19. The substrate processing apparatus of claim 16, wherein the temperature measurement unit comprises a first body portion extending from the threaded portion, and a ceramic film that wraps the first body portion.

20. The substrate processing apparatus of claim 16, wherein the temperature measurement unit comprises a first body portion extending from the threaded portion, a second body portion having a hollow portion, and a spring disposed within the hollow portion, wherein an upper portion of the first body portion extends within the hollow portion of the second body portion such that the first and second body portions have a movable, telescoping relationship relative to each other.

* * * * *